United States Patent
Chang et al.

(10) Patent No.: US 8,823,157 B2
(45) Date of Patent: Sep. 2, 2014

(54) THREE DIMENSIONAL LIGHT-EMITTING-DIODE (LED) STACK AND METHOD OF MANUFACTURING THE SAME

(75) Inventors: Liann-Be Chang, Tao-Yuan (TW); Jun-Yui Chen, New Taipei (TW)

(73) Assignee: Chang Gung University, Tao-Yuan (TW)

(*) Notice: Subject to any disclaimer, the term of this patent is extended or adjusted under 35 U.S.C. 154(b) by 0 days.

(21) Appl. No.: 13/489,527

(22) Filed: Jun. 6, 2012

(65) Prior Publication Data

US 2012/0313119 A1  Dec. 13, 2012

(30) Foreign Application Priority Data

Jun. 10, 2011  (TW) .............................. 100120343 A

(51) Int. Cl.
*H01L 33/08* (2010.01)

(52) U.S. Cl.
USPC ................................ 257/686; 257/88; 257/89

(58) Field of Classification Search
USPC ............................................ 257/686, 88, 89
See application file for complete search history.

(56) References Cited

U.S. PATENT DOCUMENTS

| | | | |
|---|---|---|---|
| 5,696,389 A * | 12/1997 | Ishikawa et al. | 257/99 |
| 5,739,552 A * | 4/1998 | Kimura et al. | 257/89 |
| 5,757,026 A * | 5/1998 | Forrest et al. | 257/40 |
| 5,965,907 A * | 10/1999 | Huang et al. | 257/89 |
| 6,100,103 A * | 8/2000 | Shim et al. | 438/26 |
| 6,586,874 B1 * | 7/2003 | Komoto et al. | 313/503 |
| 7,514,280 B2 * | 4/2009 | Lee | 438/28 |
| 7,667,383 B2 * | 2/2010 | Choong | 313/498 |
| 7,682,850 B2 * | 3/2010 | Harbers et al. | 438/25 |
| 7,732,803 B2 * | 6/2010 | Shum et al. | 257/13 |
| 8,089,074 B2 * | 1/2012 | Kim et al. | 257/79 |
| 8,362,512 B2 * | 1/2013 | Hussell et al. | 257/99 |
| 2007/0170444 A1 * | 7/2007 | Cao | 257/89 |
| 2008/0251799 A1 * | 10/2008 | Ikezawa | 257/89 |
| 2012/0091474 A1 * | 4/2012 | Or-Bach et al. | 257/88 |

* cited by examiner

*Primary Examiner* — Eugene Lee

(74) *Attorney, Agent, or Firm* — Rosenberg, Klein & Lee

(57) ABSTRACT

A three dimensional (3-D) light-emitting-diode (LED) stack and method of manufacturing the same, comprising: a substrate; at least a first LED, stacked on said substrate; and at least a second LED, stacked on said first LED, such that energy gap of said first LED is smaller than energy gap of said second LED. In said stack mentioned above, a material of larger energy gap capable of emitting light of shorter wavelength can be penetrated by lights emitted by another material of smaller energy gap capable emitting lights of longer wavelength, such that lights are mixed together and then emitted, and said materials are put into a three dimensional stack arrangement, to form a brand new light emitting device of mixed light, so as to emit lights as required.

8 Claims, 5 Drawing Sheets

THREE DIMENSIONAL LIGHT-EMITTING-DIODE (LED) STACK AND METHOD OF MANUFACTURING THE SAME

BACKGROUND OF THE INVENTION

1. Field of the Invention

The present invention relates to a light-emitting-diode (LED) and method of manufacturing the same, and in particular to a three dimensional (3-D) LED stack and method of manufacturing the same.

2. The Prior Arts

The light-emitting-diode (LED) is a special type of semiconductor diode developed in 1960'. The simplest configuration of LED includes a pn junction formed between a p-type semiconductor and an n-type semiconductor. When a current flows through the pn junction, charged carriers such as electrons and holes are generated. Then, the electrons and holes are combined to produce and emit photons to achieve release of energy. Recently, a high performance LED further includes one or more light emitting layers, sandwiched between the p-type and the n-type semiconductor regions, to improve the light emitting performance. The one or more light emitting layers mentioned above are used to obtain the light emitting wavelength desired. The basic structure of LED includes a small block of stacked layers of materials mentioned above, and is usually referred to as a die. The die can be placed on a frame or a substrate for electric contact or mechanical support, and it is glued for protection.

To the light-emitting-diode (LED), the wavelength of the light emitted depends on the difference of energy band gaps of the light emitting layers. The semiconductor compound suitable for used as material of light emitting layer has energy gap that can produce and emit infrared light, visible light, or ultraviolet light. AlGaInP is a typical material used for light-emitting-diode, due to its high quantum light emitting efficiency, namely high illumination, and adjustable colors. The energy gap variations of alloy $(Al_xGa_{1-x})_{1-y}In_yP$ depend on the x and y values of the compound, and color range of AlGaInP LED is between green light and red light. In general, AlGaInP LED is produced on a lattice matching GaAs substrate, and is formed by epitaxy, such as Metal Organic Chemical Vapor Deposition (MOCVD).

In 1990s, the GaN (Gallium Nitride) series violet light, blue light, and green light LEDs are developed and produced. For the GaN-series direct energy gap semiconductor, the energy gap difference is about 3.4 eV. The wavelength of the photons produced by recombination of electrons-holes in Gallium Nitride is 360 nm, namely in a range of ultraviolet light. For visible light (green light, blue light, and violet light) LED, $In_zGa_{1-z}N$ can be used to produce the light emitting layer, sandwiched between a p-type GaN layer and an n-type GaN layer. The wavelength λ, of light emitted by $In_zGa_{1-z}N$ series LED can be varied depending on z value of the compound. For example, to pure blue light (wavelength λ=470 nm), z value is 0.2. Similarly, Gallium Nitride LED must be produced on a lattice matching sapphire or SiC substrate, and is formed by epitaxy, such as Metal Organic Chemical Vapor Deposition (MOCVD).

In the past, quite a lot of researches have been conducted to develop white light LED to replace the conventional light source. Presently, the following approaches are used to produce white light LED:

(1) Put separate and independent red light, green light, and blue light LEDs into a "light source". Utilize various optical elements to mix the lights emitted by the red light, green light, and blue light LEDs. However, since different color LEDs require different operation voltages, hereby requiring multiple control circuits. Moreover, the service lives of different color LEDs are different. So after long period of usage, some of the LEDs will deteriorate or just fail, thus color of the mixed light will change evidently.

(2) Utilize phosphor material to convert part of lights of the short wavelength into lights of long wavelength. In this respect, the most frequently used approach is to put yellow phosphor powder around the blue light InGaN LED chip. The yellow phosphor powder is made by doping material Ce into yttrium aluminum garnet crystal, namely YAG:Ce. Part of the blue light emitted by the InGaN LED chip is converted by YAG:Ce into yellow light. However, the white light produced in this approach only includes lights of two colors: blue light and yellow light; thus that is only applicable to the indication lamps.

(3) In order to produce white light, utilize the ultraviolet (UV) light produced by ultra-short wavelength LED to agitate several different phosphor materials, to produce mixed lights of various colors. The shortcoming of this approach is that, the service life of UV LED is rather short compared with other LEDs. Furthermore, the UV light emitted by LED is hazardous to the human body. And at present, most of packaging materials are not able to effectively shield off the UV radiation.

In the prior art, white light LED light source of high efficiency and good chroma have been developed. For example, a photon recycling concept is disclosed in the following article to produce high brightness white light LED: Guo et al., "Photon—Recycling for High Brightness LEDs", compound semiconductor 6(4) May/June, 2000. Photon Recycling refers to a process of short wavelength photons being absorbed by a light emitting material, so that this material is able to emit long wavelength photons. Basically, the photon recycling semiconductor (PRS) LED is able to emit white light effectively to a brightness of 330 lumen/watt. However, the drawback of PRS-LED is its rather low color rendering index.

The double color PRS-LED proposed by Guo et al. includes a first color light source and a second color light source. The second color light source is provided with a second light emitting layer. The first color light source is used to produce blue light. The blue light thus produced is directed toward the second light emitting layer, so that part of the blue light is absorbed, and then yellow light is produced in a light re-emitting process. Basically, the double color photons generated by PRS-LED are similar to that generated by LED applied with phosphor material. However, its difference with the LED applied with phosphor powder is that, the second color light source includes phosphor semiconductor material (AlGaInP), that is bonded directly onto the first color light source wafer. Therefore, the double color PRS-LED can be produced directly on a wafer.

Refer to FIG. 1 for a cross section view of a PRS-LED structure according to the prior art. As shown in FIG. 1, the PRS-LED structure 10 includes a transparent substrate 12; a first color light source; and a second color light source. Wherein, the transparent substrate is for example a sapphire substrate, the first color light source and the second color light source are on opposite sides of the substrate 12. The first color source includes a p-type GaN layer 14, an active layer 16 formed by InGaN, and an n-type GaN layer 18. The layers mentioned above are formed on the substrate 12 by means of epitaxy growth. The second color light source includes AlGnInP layer 22. The AlGnInP layer 22 is formed on a GaAs substrate (not shown) by epitaxy growth. Then, gluing material 24 is used to glue it onto the substrate 12. Subsequently, the GaAs substrate is removed through chemical-assisted polishing and selective wet etching. Then, the first color light source is patterned, to form an n-type contact 26 and a p-type contact 28 by using aluminum. The n-type contact 26 is deposited on region of n-type GaN layer 18, while p-type contact 28 is deposited on region of p-type GaN layer 14.

The output of the first color light source is produced when a current is flowed into the active layer 16, such that the wavelength of light emitted by the first color light source is 470 nm (blue light). In operation, part of light emitted by the first color light source is absorbed by the AlGnInP layer 22, then light is re-emitted (or re-utilized) to have longer wavelength. The composition of the AlGnInP layer 22 is so selected that it can re-emit light of wavelength 570 nm (yellow light). Since the colors of lights emitted by the first color light source and the second color light source are mutually complementary, therefore, to the human eye, the light output after combination appears to be white light. However, for the PRS-LED structure mentioned above, the emitted white light includes blue light of 470 nm and yellow light of 570 nm, wherein, red light of 650 nm is not included, thus leading to poor color rendering index.

Therefore, presently, the design and performance of PRS-LED structure is not quite satisfactory, and it has much room for improvements.

SUMMARY OF THE INVENTION

In view of the problems and drawbacks of the prior art, the present invention provides a three dimensional (3-D) LED stack and method of manufacturing the same, so as to overcome the shortcomings of the prior art.

A major objective of the present invention is to provide a three dimensional (3-D) LED stack and method of manufacturing the same. Wherein, a material of larger energy gap capable of emitting light of shorter wavelength can be penetrated by lights emitted by another material of smaller energy gap capable emitting lights of longer wavelength, such that lights are mixed together and then emitted, and the materials are put into a three dimensional stack arrangement, to form a brand new light emitting device of mixed light, so as to emit the lights as required.

Another objective of the present invention is to provide a three dimensional (3-D) LED stack and method of manufacturing the same, that is capable of raising element concentration per unit area.

A further objective of the present invention is to provide a three dimensional (3-D) LED stack and method of manufacturing the same, that is simple in construction and easy to produce, thus saving the overall production cost.

In order to achieve the above-mentioned objective, the present invention provides a three dimensional (3-D) LED stack, comprising: a substrate, at least a first light-emitting-diode (LED) stacked on the substrate, and at least a second LED stacked on the first LED, such that the energy gap of the first LED is smaller than that of the second LED.

The present invention also provides a three dimensional (3-D) LED stack manufacturing method, comprising the following steps: provide a substrate; stack at least a first light-emitting-diode (LED) on the substrate; provide a first light transmission material; stack at least a second LED on the first light transmission material; glue the first light transmission material on the first LED, such that the energy gap of the first LED is smaller than that of the second LED.

Further scope of the applicability of the present invention will become apparent from the detailed descriptions given hereinafter. However, it should be understood that the detailed descriptions and specific examples, while indicating preferred embodiments of the present invention, are given by way of illustration only, since various changes and modifications within the spirit and scope of the present invention will become apparent to those skilled in the art from this detailed descriptions.

BRIEF DESCRIPTION OF THE DRAWINGS

The related drawings in connection with the detailed descriptions of the present invention to be made later are described briefly as follows, in which:

FIG. 2(*b*) is a flowchart of the steps of a method of manufacturing a three-dimension light-emitting-diode (LED) stack of FIG. 2(*a*);

FIG. 3(*b*) is a flowchart of the steps of a method of manufacturing three-dimension light-emitting-diode (LED) stack of FIG. 3(*a*);

DETAILED DESCRIPTION OF THE PREFERRED EMBODIMENT

The purpose, construction, features, functions and advantages of the present invention can be appreciated and understood more thoroughly through the following detailed descriptions with reference to the attached drawings.

The present invention provides a three dimensional light-emitting-diode (LED) stack. Wherein, material of larger energy gap capable of emitting light of shorter wavelength, can be penetrated by lights emitted by another material of smaller energy gap capable emitting lights of longer wavelength, such that lights are mixed together and then emitted, and the materials are put into a three dimensional stack arrangement, to form a brand new light emitting device of mixed light, to emit the lights required, and that is different from the conventional planar LED of mixed light.

In the present invention, the structure of three dimensional light-emitting-diode (LED) stack must be arranged in a specific sequence, to take into consideration that whether the upper layer LED can block and absorb the lights emitted from the lower layer LED. However, for a planar light emitting device, this consideration is not necessary. In the three dimensional (3-D) LED stack arrangement of the present invention, the LED layers are arranged in a specific sequence, the upper the LED layer, the wider its energy gap is required. Suppose the energy gap of LED of the upper most layer is Eg1, and the rest in sequence are Eg2,Eg3,Eg4 . . . , etc., then it must satisfy the condition that Eg1>Eg2>Eg3>Eg4. In this approach and according to the principle of physics, for an LED, the larger its energy gap, the shorter the wavelength of the light it emits. In other words, the upper the LED layer in the stack, the wider its energy gap, and the greater the light energy it can absorb. For the light of longer wavelength, since its energy is not high, so it is not apt to be absorbed. Therefore, to the light source emitting lights of longer wavelength and thus having lower energy, the LED of wider energy gap and emitting light of shorter wavelength can be transparent. Since it is transparent, so that the lights of longer wavelength and lower energy are able to transmit through the LED directly.

Approach of Implementation

By way of example, by combining more than two types of LEDs, lights of various colors can be produced. Though this approach is the same as the conventional planar packaging, yet in the present invention, it is made more dense and compact, so that various wavelengths of lights can be produced in the same unit area. As such, the area occupied can be reduced. In the advance of technology today, size reduction is an important factor, thus light weight, thin profile, and compact size are the trend of development of the electronic products. The LED stack disclosed in the present invention is in conformity with this trend.

In the following embodiments, the stack of LEDs can be realized through Wafer Bonding or Flip-Chip.

Figure 1:
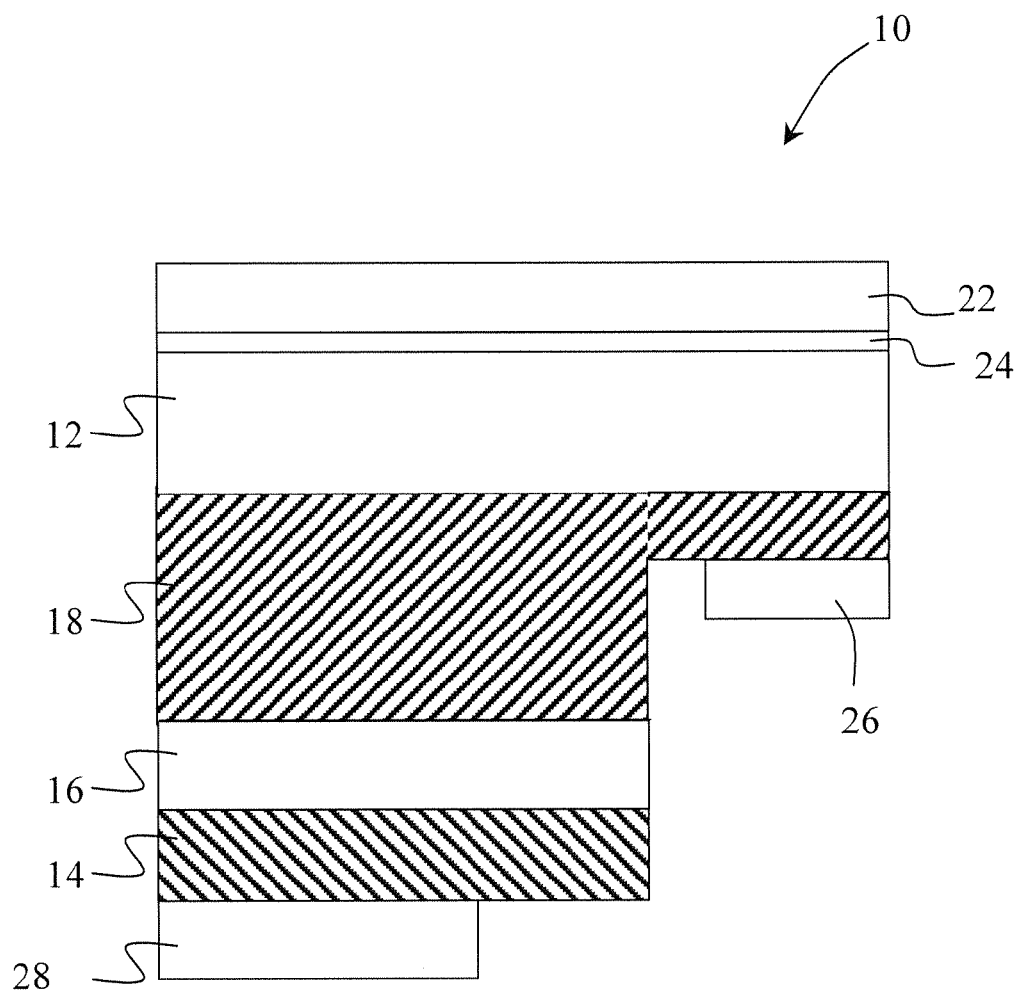
FIG. 1 is a cross section view of a PRS-LED structure according to the prior art.
Figure 2:
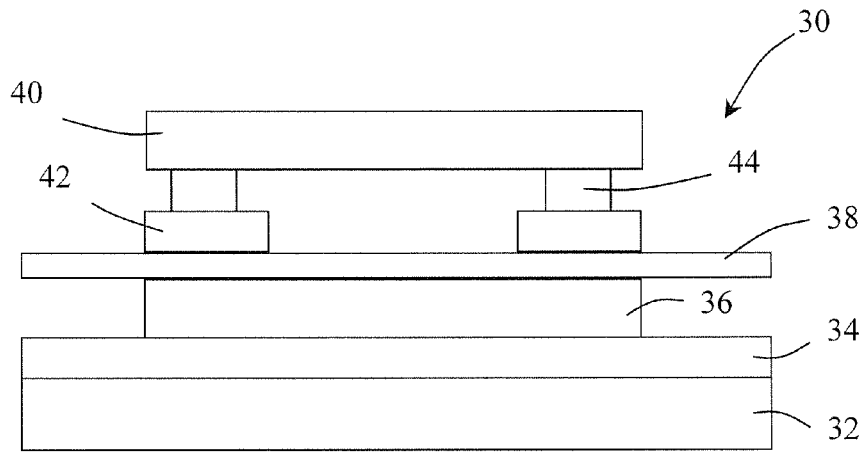
FIG. 2(*a*) is a schematic diagram of a three dimensional light-emitting-diode (LED) stack according to a first embodiment of the present invention.
Figure 2:
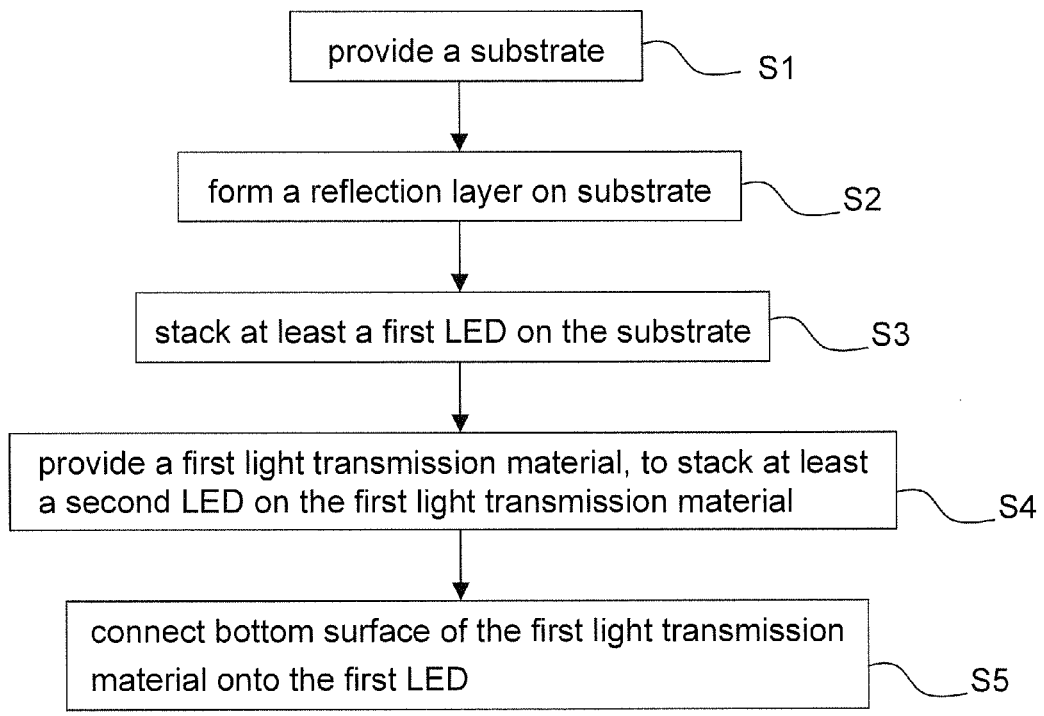

Refer to FIG. 2(a) for a schematic diagram of a three dimensional light-emitting-diode (LED) stack according to a first embodiment of the present invention. As shown in FIG. 2(a), the three dimensional LED stack 30 comprises: a substrate 32, on its surface is provided with a reflection layer 34, such as metal layer; at least a first LED 36 stacked on a reflection layer 34 of the substrate 32; a first light transmission material 38, stacked on the first LED 36; and at least a second LED 40 stacked on the surface of the first light transmission material 38. Wherein, the energy gap of the first LED 36 is smaller than the second LED 40.

Moreover, on the top surface of the first light transmission material 38 is provided with a first conduction layer 42, to form electrical connection with the second LED 40. The electrical connection can be achieved as shown in FIG. 2(a) through providing at least a bump 44 on the bottom surface of the second LED 40, then flip-mounted it onto the first conduction layer 42.

In the selection of the first LED 36 and the second LED 40, the following approach can be utilized. By way of example, when the first LED 36 is a red light LED, the second LED 40 is yellow light LED, then a warm white light can be produced. When the first LED 36 is a green light LED, the second LED 40 is a blue light LED, then a cool white light can be produced. When the first LED 36 is a red light LED or amber light LED, and the second LED 40 is blue light LED, then a cool white light can be produced.

When the embodiment shown in FIG. 2(a) is taken as an example, then its manufacturing process is as shown in FIG. 2(b). As shown in FIG. 2(b), firstly, as shown in step S1, provide a substrate 32. Next, as shown in step S2, form a reflection layer 34 on the substrate. Then, as shown in step S3, stack at least a first LED 36 on the reflection layer 34 of the substrate 32. Subsequently, as shown in step S4, provide a first light transmission material 38, to stack at least a second LED 40 on the first light transmission material 38. Herein, the stacking can be realized through a flip-chip technology: namely, the bottom surface of the second LED 40 is provided with a first bump 44, and the surface of the first light transmission material 38 is provided with a first conduction layer 42, then the first bump 44 is connected to the first conduction layer 42 to form electrical connection. Finally, as shown in step S5, connect the bottom surface of the first light transmission material 38 to the first LED 36.

Figure 3:
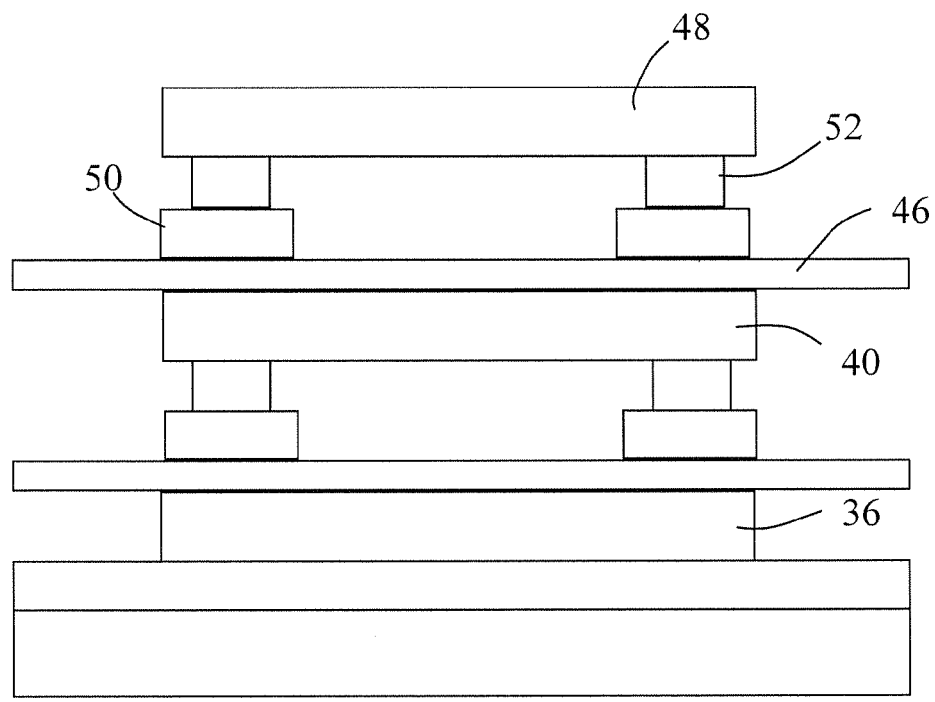
FIG. 3(*a*) is a schematic diagram of a three dimensional light-emitting-diode (LED) stack according to a second embodiment of the present invention.
Figure 3:
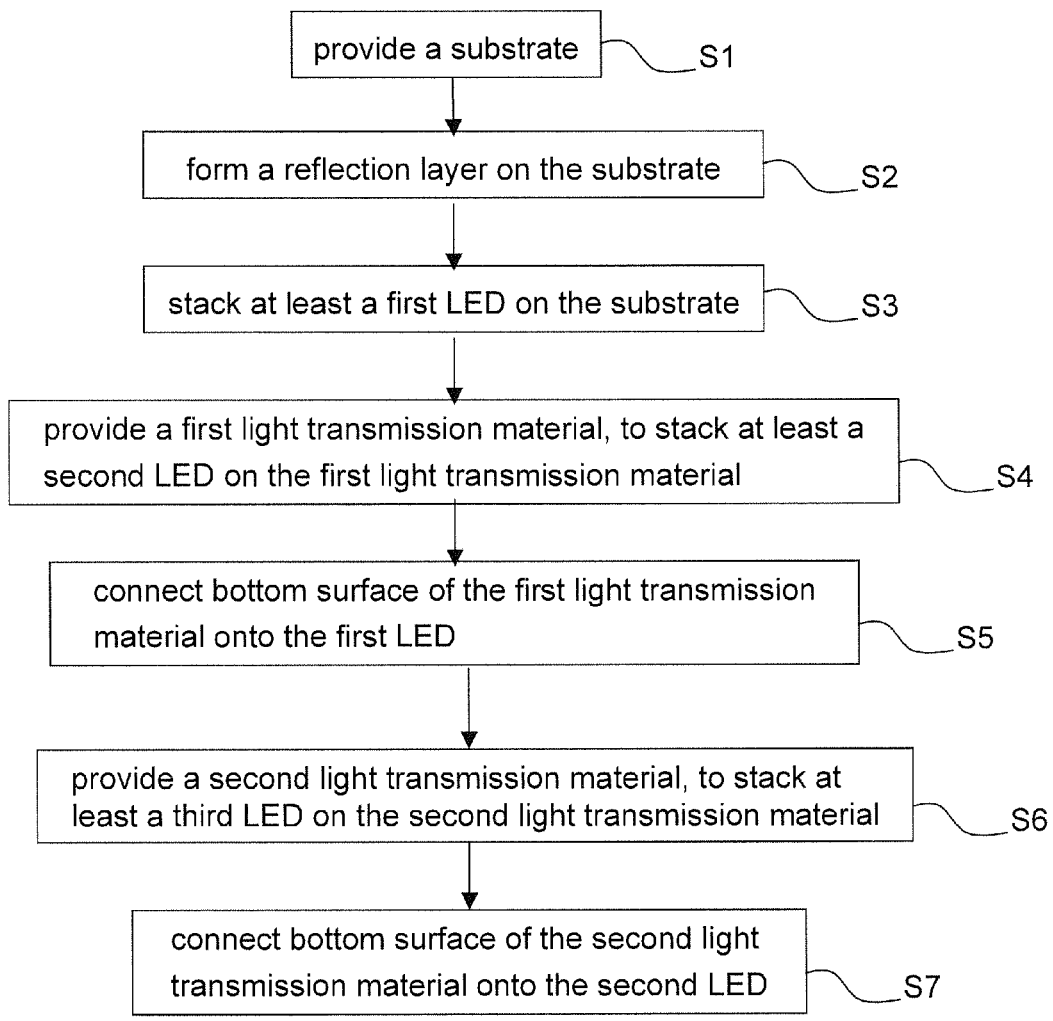

Then, refer to FIG. 3(a) for a schematic diagram of a three dimensional light-emitting-diode (LED) stack according to a second embodiment of the present invention. The difference between the second embodiment and the first embodiment is that, in the second embodiment, a second light transmission material 46 is included, and at least a third LED 48 is provided on the second light transmission material 46. The second light transmission material 46 is stacked on the second LED 40, so that the energy gap of the second LED 40 is smaller than that of the third LED 48. On the top surface of the second light transmission material 46 is provided with a second conduction layer 50, and the bottom surface of the second LED 40 is provided with at least a bump 52, to form a flip-chip like connection.

Refer to FIG. 3(b) for a flowchart of the steps of a method of producing three dimensional light-emitting-diode (LED) stack of FIG. 3(a). The difference between FIG. 3(b) and FIG. 2(b) is that, in FIG. 3(b), it further includes a step S6 and a step S7. In step S6, provide a second light transmission material 46, and stack at least a third LED 48 on the second light transmission material 46. Then, in step S7, stack the second light transmission material 46 on the second LED 40.

In the second embodiment, when the first LED 36 is a red light LED, the second LED 40 is green light LED, and the third LED 48 is blue light LED, then a pure white light, a warm white light, or a cool white light can be produced.

Or, alternatively, when the first LED 36 is a mixed color light LED, the second LED 40 is a green light LED, and the third LED 48 is a blue light LED, then a cool white light can be produced.

Figure 4:
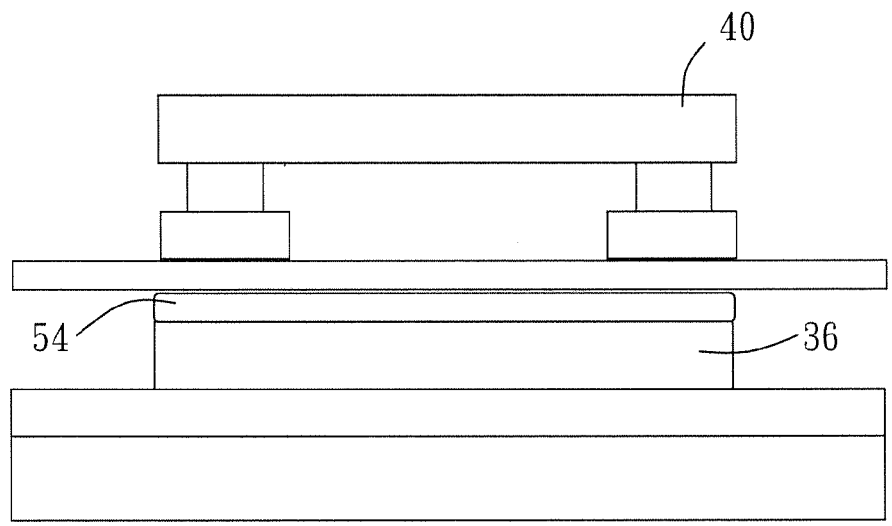
FIG. 4 is a schematic diagram of a three dimensional light-emitting-diode (LED) stack according to a third embodiment of the present invention.

Refer to FIG. 4 for a schematic diagram of a three dimensional light-emitting-diode (LED) stack according to a third embodiment of the present invention. The difference between the third embodiment and that of FIG. 2(a) of the first embodiment is that, a phosphor powder layer 54 is applied on the surface of the first LED 36.

By way of example, when the first LED 36 is blue light LED, the phosphor powder layer 54 is a yellow light phosphor powder layer, the second LED 40 is a red or amber light LED, then a cool white light can be produced.

Figure 5:
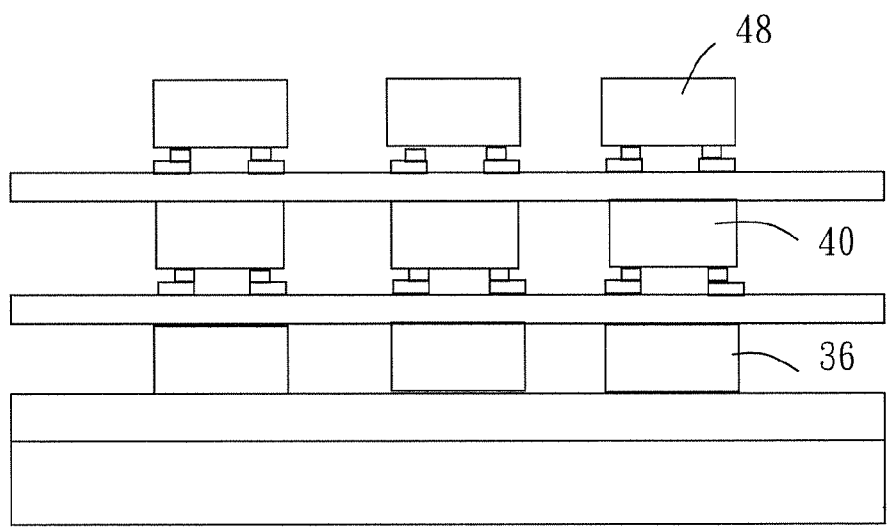
FIG. 5 is a schematic diagram of a three dimensional light-emitting-diode (LED) stack according to a fourth embodiment of the present invention.

Finally, refer to FIG. 5 for a schematic diagram of a three dimensional light-emitting-diode (LED) stack according to a fourth embodiment of the present invention. In this embodiment, in addition to a single chip LED package, a combined multi-chip LED package can also be adopted to meet the market demand of solid state illumination. As shown in FIG. 5, for the respective first LED 36, the second LED 40, and the third LED 48, a combined three-chip LED package can be used.

Moreover, in using the flip-chip approach to achieve a stack, a bump is used to connect to the chip. As compared with the conventional wire bonding of LED, it is more convenient to connect to the chip, and electric connection is more effective. Furthermore, since the flip-chip approach is to flip-mount the LED, the light output area blocked by the electrode is reduced, therefore, light emitting efficiency is increased.

Summing up the above, the present invention discloses a brand new three dimensional light-emitting-diode (LED) stack and method of manufacturing the same, wherein, photon transmission structure is used instead of the three dimensional package structure of photon recycling semiconductor (PRS). In the present invention, a material of larger energy gap capable of emitting light of shorter wavelength can be penetrated by lights emitted by another material of smaller energy gap capable emitting lights of longer wavelength, such that lights are mixed together and then emitted. In the present invention, lights of two different light sources can be mixed to produce white light, in addition, lights of three original colors of red, green, and blue can be mixed to produce white light of better color rendering index.

In the present invention, the LEDs in a three dimensional LED stack can be arranged and adjusted, to produce lights of various wavelengths as required. Compared with the planar light-emitting-diode arrangement of the prior art that emits lights of various colors, in the present invention, the area occupied by LEDs of various colors can be reduced, so that more LEDs can be arranged on the same unit area of a substrate, hereby raising effectively the overall cost effectiveness, conductivity, and illumination, in achieving better pairing of electrons and holes, thus making the three dimensional LED stack simple in construction and easy to produce, so as to save the overall cost.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. A three dimensional light-emitting-diode (LED) stack, comprising:
    a substrate;
    a plurality of Light Emitting Diodes stacked on said substrate, wherein each of said plurality of Light Emitting Diodes includes a p-type layer, an n-type layer, and a planar active layer made from an inorganic semiconductor material sandwiched between one of said p-type layers and one of said n-type layers, wherein said Light Emitting Diodes of said plurality thereof are devoid of p-type layers and n-type layers shared in common between two of said Light Emitting Diodes, and said plurality of Light Emitting Diodes are further devoid of filters, said plurality of Light Emitting Diodes being electrically and structurally intercoupled by solder bumps,
    wherein said plurality of Light Emitting Diodes include:
    at least a first Light Emitting Diode (LED) stacked on said substrate, and
    at least a second LED stacked on said first LED at a distance from said substrate larger than said first LED, wherein an energy gap of said first LED is smaller than an energy gap of said second LED;
    a first light transmission material disposed between said first LED and said second LED; and
    a first conduction layer disposed on a top surface of said first light transmission material and connected electrically to at least said second LED.

2. The three dimensional light-emitting-diode (LED) stack as claimed in claim 1, wherein said substrate is provided with a reflection layer formed between said substrate and said first LED positioned on the top of said substrate.

3. The three dimensional light-emitting-diode (LED) stack as claimed in claim 1, further including at least one bump disposed on a bottom surface of said second LED, wherein said at least one bump is electrically connected between said second LED and said first conduction layer on the top of said first light transmission material.

4. The three dimensional light-emitting-diode (LED) stack as claimed in claim 1, further comprising a second light transmission material stacked above said second LED, and wherein said plurality of LEDs further include at least a third LED disposed above said second light transmission material stacked on said second LED, wherein the energy gap of said second LED is smaller than that of said third LED.

5. The three dimensional light-emitting-diode (LED) stack as claimed in claim 4, wherein a top surface of said second light transmission material is provided with a second conduction layer to connect electrically said second light transmission material to said third LED.

6. The three dimensional light-emitting-diode (LED) stack as claimed in claim 5, further including at least a second bump disposed on a bottom surface of said third LED, wherein said second bump is connected electrically between said second conduction layer and said third LED.

7. The three dimensional light-emitting-diode (LED) stack as claimed in claim 1, further including a phosphor powder layer applied on an uppermost side of said first LED or of said second LED.

8. A three-dimensional Light Emitting Diode (LED) stack, comprising:
    a substrate,
    a plurality of multi-chip LED packages stacked and intercoupled electrically and structurally by solder bumps in a predetermined order above said substrate, each multi-chip LED package including a plurality of corresponding LEDs, wherein an energy gap of said corresponding LEDs in an underlying multi-chip LED package is smaller than an energy gap of said corresponding LEDs in a subsequent multi-chip LED package disposed above said underlying multi-chip LED package and spaced apart from said substrate a distance larger than said underlying multi-chip LED package,
    wherein each of said LEDs includes a p-type layer, an n-type layer, and a planar active layer made from an inorganic semiconductor material sandwiched between one of said p-type layers and one of said n-type layers, said LEDs are devoid of p-type layers and n-type layers shared in common between two of said LEDs and said LEDs are further devoid of filters.

* * * * *